United States Patent [19]
Tielert et al.

[11] Patent Number: 5,777,482
[45] Date of Patent: Jul. 7, 1998

[54] CIRCUIT ARRANGEMENT AND METHOD FOR MEASURING A DIFFERENCE IN CAPACITANCE BETWEEN A FIRST CAPACITANCE $C_1$ AND A SECOND CAPACITANCE $C_2$

[75] Inventors: Reinhard Tielert, Winnweiler; Andreas Hildebrandt, Speyer, both of Germany

[73] Assignee: Siemens Aktiengesellschaft, Munich, Germany

[21] Appl. No.: 675,590

[22] Filed: Jul. 3, 1996

[30] Foreign Application Priority Data

Jul. 4, 1995 [DE] Germany ............... 195 24 387.0

[51] Int. Cl.$^6$ ........................ G01R 27/26
[52] U.S. Cl. ................... 324/678; 340/870.37
[58] Field of Search ........................ 324/678, 658, 324/679, 672; 340/870.37; 73/718

[56] References Cited

U.S. PATENT DOCUMENTS

| 4,736,629 | 4/1988 | Cole | 324/678 |
|---|---|---|---|
| 5,343,157 | 8/1994 | Deschamps | 324/678 |
| 5,629,629 | 5/1997 | Tielert | 324/678 |

FOREIGN PATENT DOCUMENTS

| 0 166 705 A2 | 1/1986 | European Pat. Off. . |
|---|---|---|
| 0 166 706 B1 | 1/1986 | European Pat. Off. . |
| 35 19 390 C2 | 12/1985 | Germany . |
| 39 19 191 A1 | 12/1990 | Germany . |
| 43 13 327 A1 | 10/1994 | Germany . |

Primary Examiner—Maura K. Regan
Attorney, Agent, or Firm—Hill & Simpson

[57] ABSTRACT

The circuit arrangement and method is for measuring a difference in capacitance between a first capacitance ($C_1$) and a second capacitance ($C_2$). A hitherto necessary compensation of a plurality of parasitic effects has become unnecessary due to isolated measurement of an unwanted capacitance ($C_P$) with which parasitic effects, to which the first capacitance ($C_1$) and the second capacitance ($C_2$) are subject, are modelled. When an evaluation logic (AL) realized in digital form is employed, only one counter unit wherein a binary value proportional to the respectively measured capacitance is counted need be provided. By cyclical measurement of the unwanted capacitance ($C_P$), the first capacitance ($C_1$), the second capacitance ($C_2$) and, at the end, the unwanted capacitance ($C_P$) are determined. The unwanted capacitance ($C_P$) is compensated when the counter unit respectively counts backward when "counting" the unwanted capacitance ($C_P$) but otherwise counts forward. Each sub-cycle (T1,T2,T3,T4) lasts exactly N clocks, whereby the clocks are supplied by a measuring oscillator (MO). The clocks are dependent on the capacitance respectively measured.

8 Claims, 9 Drawing Sheets

LOADN :READ IN PRE-OCCUPATION VALUE
UPDOWNN :CONTROLLING OF THE COUNTING DIRECTION
ENABLEHF :COUNTER ACTIVATION
DATA :PRE-OCCUPATION VALUE

CIRCUIT ARRANGEMENT AND METHOD FOR MEASURING A DIFFERENCE IN CAPACITANCE BETWEEN A FIRST CAPACITANCE $C_1$ AND A SECOND CAPACITANCE $C_2$

BACKGROUND OF THE INVENTION

The measurement of small capacitances is a recurring objective, for example in the evaluation of capacitative sensors. Problems in the measurement of small capacitances particularly occur due to parasitic effects that must be compensated in the measurement.

European reference EP 0 166 706 B1 discloses a method for measuring capacitances wherein a capacitance to be measured and a reference capacitance are successively connected in alternation to input terminals of a measuring oscillator. The method disclosed by this document has a number of disadvantages. Given capacitors with extremely small values of capacitance, the sensitivity of the circuit is reduced by additional capacitances. The proposed counter-measures contain an increased outlay, additional temperature drift if the voltage of the output buffer is not likewise temperature-compensated, as well as a reduction in the signal-to-noise ratio or, respectively, the resolution.

Further, various methods and circuit arrangements are known for measuring a capacitance or, respectively, a difference in capacitance between small capacitances (European reference EP 0 166 705 A2; German reference DE 35 19 390 C2; German reference DE 43 13 327 A1; German reference DE 39 19 191 A1).

The solution for temperature compensation proposed in European reference EP 0 166 706 B1, employing an additional capacitance, increases the non-linear behavior of the method. The sensitivity is thereby also reduced and the additional capacitance must be individually selected in view of its size as well as its temperature coefficient. For suppressing disturbances that are caused by the switching of the capacitances, this document also proposes that the division number N be selected adequately large. This leads to a longer measuring time, which represents a further disadvantage of this prior art method.

SUMMARY OF THE INVENTION

It is an object of the present invention to provide an improved circuit arrangement for measuring a difference in capacitance between two capacitances that avoids the problems described above. The present invention is also based on the problem of specifying a method for measuring a difference in capacitance between two capacitances that avoids the prior art problems described above.

In general terms the present invention is a circuit arrangement for measuring a difference in capacitance between a first capacitance and a second capacitance. A switch unit is provided that, dependent on a switch position is connected to the first capacitance, the second capacitance or to neither of the two capacitances. The switch unit is controlled by a period counter via a first output of the period counter. A square-wave generator connected to the switch unit, is provided. A square-wave generator connected to the switch unit is provided. The square-wave generator supplies a square-wave signal having a frequency dependent on the adjacent capacitance that is selected by the switch unit. A first input of the period counter is coupled to an output of the measuring oscillator. The plurality of square-wave signals supplied by the measuring oscillator in a sub-cycle of N clocks of a measuring cycle is made available via a second output of the period counter. An evaluation logic coupled to the second output of the period counter is provided for calculating the difference in capacitance between the first capacitance and the second capacitance, whereby a value proportional to the time duration is allocated to a time duration of the respective sub-cycle, the difference in capacitance being determined therefrom.

Advantageous developments of the present invention are as follows.

The period counter has a variable bit length.

The evaluation logic is realized in analog form.

The evaluation logic is realized in digital form. The digital evaluation logic has a controller that defines the counting direction of an asynchronous counter. The asynchronous counter coupled to the controller is coupled to a high-frequency oscillator via an AND gate. The digital evaluation logic has an operation unit that is coupled to the asynchronous counter and to the controller.

The present invention is also a method for measuring a difference in capacitance between a disturbed first capacitance and a disturbed second capacitance that are under the influence of a disturbing quantity modelled by an unwanted capacitance. The following steps are provided in alternation, whereby the capacitance measurements ensue using a measuring oscillator that supplies a square-wave signal having a frequency that is dependent on the capacitance to be respectively measured. The unwanted capacitance is measured isolated. The disturbed first capacitance under influence of the unwanted capacitance, is measured, whereby the distrubed first capacitance derives from the sum of the first capacitance and the unwanted capacitance. The disturbed second capacitance under the indluence of the unwanted capacitance is measured, whereby the disturbed second capacitance derives from the sum of the second capacitance and the unwanted capacitance. The difference in capacitance between the disturbed first capacitance and the disturbed second capacitance is determined using an evaluation logic. A value indirectly proportional to the frequence is allocated to the respective frequency, the difference in capacitance being determined therefrom.

Advantageous developments of the method of the present invention are as follows.

The selection of the capacitance to be measured occurs with a switch unit that is controlled by a period counter. The plurality of square-wave signals supplied by the measuring oscillator in a sub-cycle having N clocks is counted by the period counter.

The difference in capacitance between the disturbed first capacitance and the disturbed second capacitance is determined using a digital evaluation logic. The evaluation logic for determining the difference in capacitance, has a controller that through-connects an output clock of a high-frequency oscillator via an AND gate onto an asynchronous counter that counts the plurality of output clocks. The output clock of the high-frequency oscillator is through-connected after the measuring oscillator is in a steady state.

The asynchronous counter counts backward in a first sub-cycle in the determination of the unwanted capacitance. The asynchronous counter counts forward in a second sub-cycle in the determination of the disturbed first capacitance. The value of the first capacitance now residing in the asynchronous counter is read out from the asynchronous counter. The value of the first capacitance is multiplied by a factor of 2. The value of the first capacitance multiplied by the factor 2 is deposited in a first register. The asynchronous counter counts forward in a third sub-cycle in the determination of the disturbed second capacitance. The asynchronous counter counts backward in a fourth sub-cycle in a second determination of the unwanted capacitance. The counter reading of the asynchronous counter that contains the value of the sum of the first capacitance and the second capacitance is read out. The sum value is stored in a second register. The difference in capacitance between the first capacitance and the second capacitance is calculated in an arithmetic unit according to $$\frac{C_1 - C_2}{C_1 + C_2}.$$

The difference n capacitance between the disturbed first capacitance and the disturbed second capacitance is determined using an analog evaluation logic.

Specific measures for the compensation of the temperature drift are unnecessary as a result of the inventive circuit arrangement as well as the inventive method. The sensitivity is also not reduced due to parasitic effects. A variation of the resolution of the result output is possible on the basis of one development of the circuit arrangement, as a result whereof a user-specific variation between desired speed or, respectively, desired resolution of the circuit arrangement is enabled. The measured result is made available in digital form due to another development of the circuit arrangement. An unproblematical adaptation to a micro-controller system is thereby possible. Also achieved is that no high-precision or high-stability analog components are required.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
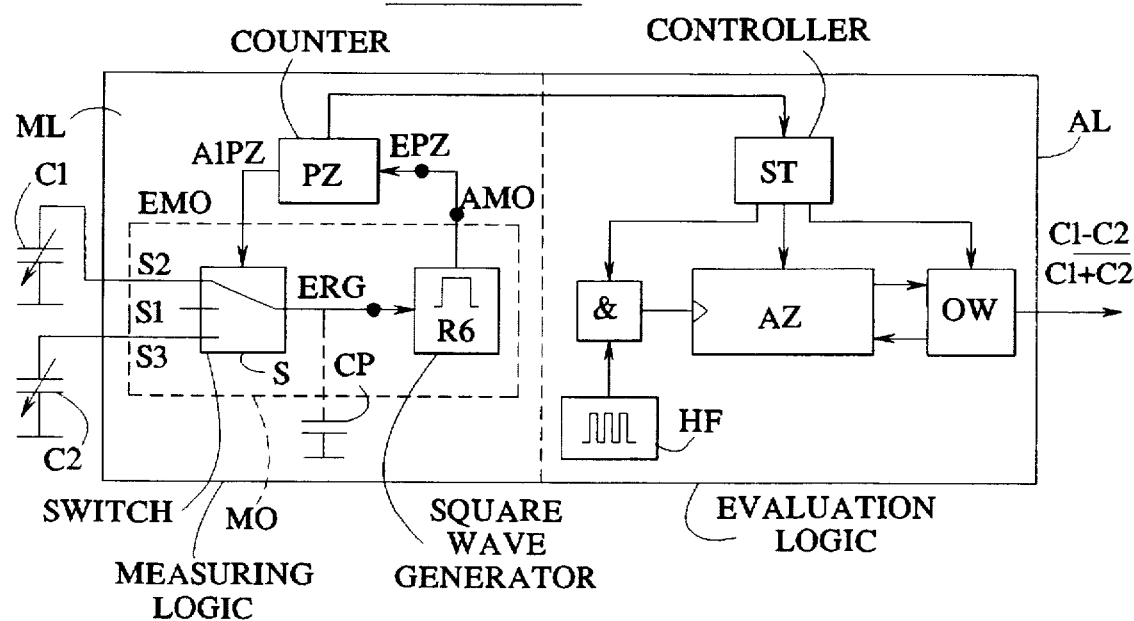
FIG. 1 is a block circuit diagram of the overall circuit arrangement composed of a measuring logic and an evaluation logic.

The inventive circuit arrangement and the inventive method are described further with reference to FIGS. 1 through 15. FIG. 1 shows the circuit arrangement of the preferred exemplary embodiment described below. The circuit arrangement has a measuring logic ML and an evaluation logic AL.

The measuring logic ML of the circuit arrangement has the function of converting a first capacitance $C_1$ and a second capacitance $C_2$ into digitally evaluatable signals. At the same time, it can be utilized for generating the switching clock for the evaluation logic AL and for informing a controller ST in the evaluation logic AL about the momentary point in time of a measuring/evaluation event using the counter reading of a period counter PZ contained in the evaluation logic AL.

The measuring logic ML has at least the following components: measuring oscillator MO having a square-wave generator RG and a switch unit S; the period counter PZ; and a voltage source REF.

The period counter PZ is coupled via a first output A1PZ of the period counter PZ to an input EMO of the measuring oscillator MO. An output AMO of the measuring oscillator MO is coupled to an input EPZ of the period counter PZ. The switch unit S has three different switch positions. In a first switch position S1, the switch is open, that is, it remains disconnected. An input ERG of the square-wave generator RG is thus disconnected, as a result whereof occurring parasitic effects that can be modelled by an unwanted capacitance $C_P$ connected in parallel are calculated isolated from the first capacitance $C_1$ and the second capacitance $C_2$. In a second switch position S2, the switch unit S is connected to the first capacitance $C_1$. A disturbed, first capacitance $C_1'$ is thus determined in the measuring oscillator MO (which is now coupled with the first capacitance $C_1$) since the first capacitance $C_1$ is under the influence of the unwanted capacitance $C_P$. In a third switch position S3, the switch unit S is coupled with the second capacitance $C_2$. In this position, the measuring oscillator can determine a disturbed, second capacitance $C_2'$ that derives from the sum of the second capacitance $C_2$ and the unwanted capacitance $C_P$.

The function of the square-wave generator RG is in generating a square-wave signal whose frequency is dependent on the capacitance adjacent at the input ERG of the square-wave generator RG. The frequency dependency of the square-wave signal on the adjacent capacitances can, for example, be proportional or can also be comprised in some other functional dependency on the adjacent capacitances.

Figure 2:
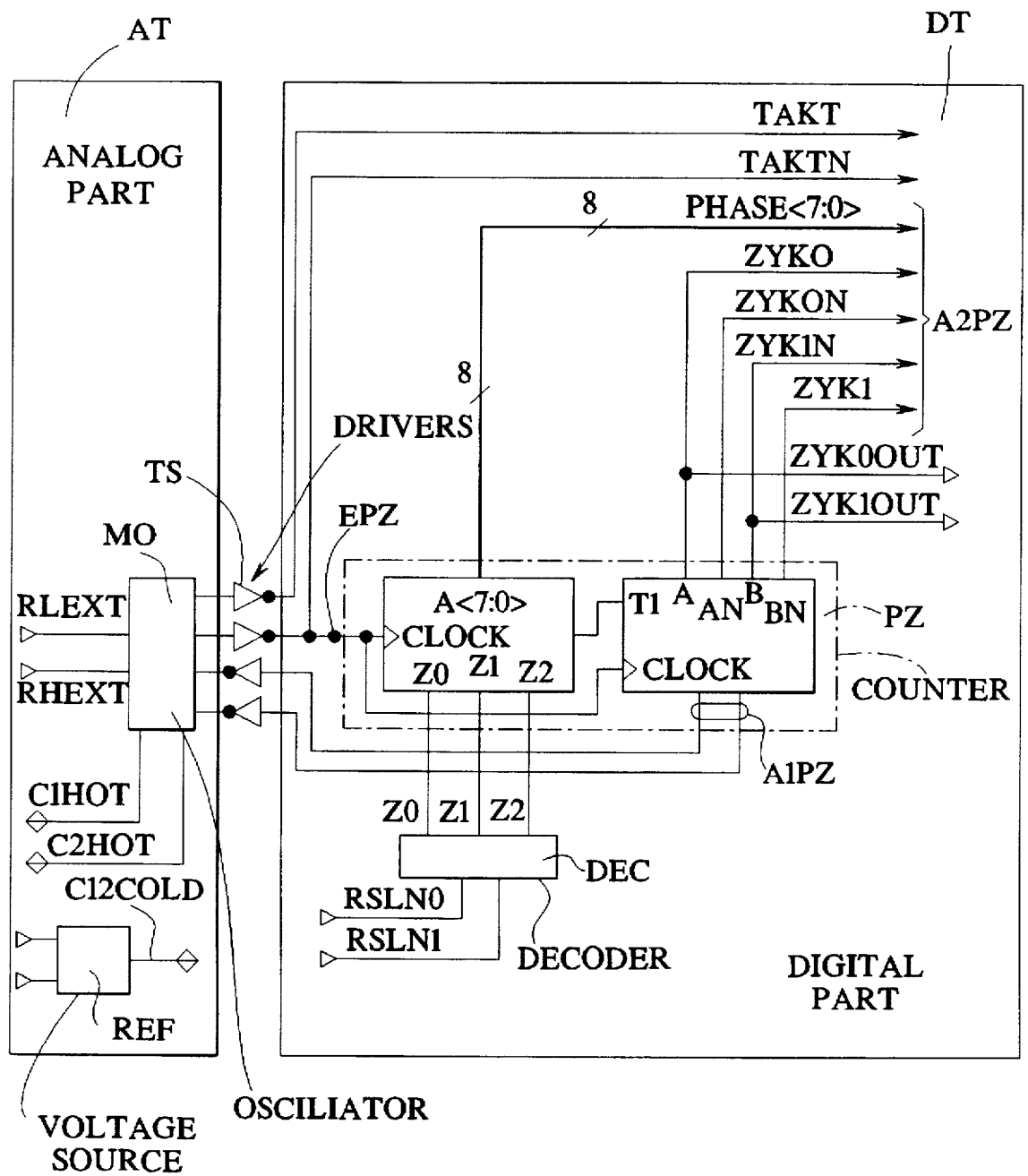
FIG. 2 is a block circuit diagram that describes the measuring logic.

The function of the period counter PZ is in the control of the switch unit S, that is, in the selection of the switch position and, thus, the selection of the capacitance to be measured and in the coordination of the evaluation logic. Inputs Z0 through Z2 of a decoder unit DEC control the number of steps of the period counter PZ when a variable bit width of the period counter PZ is provided. The voltage source REF generates an offset for the first capacitance $C_1$ and the second capacitance $C_2$. The measuring logic ML, which is shown in greater detail in FIG. 2, is divided into an analog part AT and a digital part DT. The analog part AT having the measuring oscillator MO is responsible for the conversion of the capacitance to be measured into a square-wave signal, this capacitance being respectively coupled to the measuring oscillator MO by the switch unit S. The square-wave signal clocks the period counter PZ that is located in the digital part DT of the measuring logic ML. The period counter PZ counts the clocks generated by the measuring oscillator MO and controls the switch unit S via its two most significant bits.

The voltage source REF can be particularly advantageously utilized for reducing electrostatic disturbing forces on the movable middle electrode when the first capacitance $C_1$ and the second capacitance $C_2$ are sub-capacitances of a differential capacitor.

Reactions that the digital part DT has on the analog part AT can be reduced by driver stages TS that are connected between the measuring oscillator MO and the digital part DT. When the employment of the voltage source REF is provided, a terminal C12COLD is connected to the ground points of the first capacitance $C_1$ and of the second capacitance $C_2$ in order to minimize disturbing electrostatic forces that can occur within the circuit arrangement. An external resistor can be connected to two terminals RLEXT and RHEXT in order to control the charging/discharging current of the frequency-determining capacitances. The charging/discharging current can be increased by employing the external resistor, as a result whereof larger capacitances can also be connected.

Figure 3:
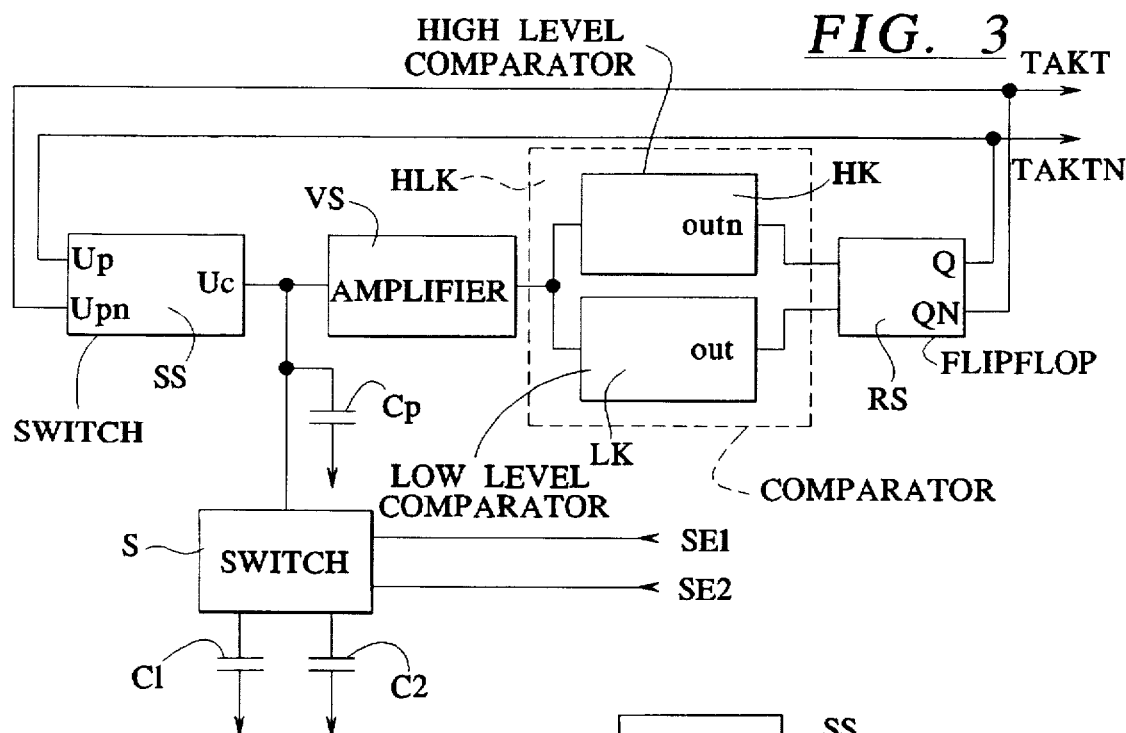
FIG. 3 is a block circuit diagram that describes the measuring oscillator of the measuring logic.

FIG. 3 shows an embodiment of a square-wave generator RG that can be provided in the inventive circuit arrangement. A person skilled in the art is aware of other square-wave generators differing from the square-wave generator described here that can likewise be employed in the inventive circuit arrangement. The function of the provided square-wave generator RG is merely to generate a variable frequency square-wave signal, whereby the frequency of the square-wave signal is dependent on the capacitance adjacent at the input ERG of the square-wave generator RG.

The square-wave generator RG described here has the following components: a current switch SS; an amplifier VS; a high/low level comparator HLK; and an RS flip-flop RS.

Figure 4:
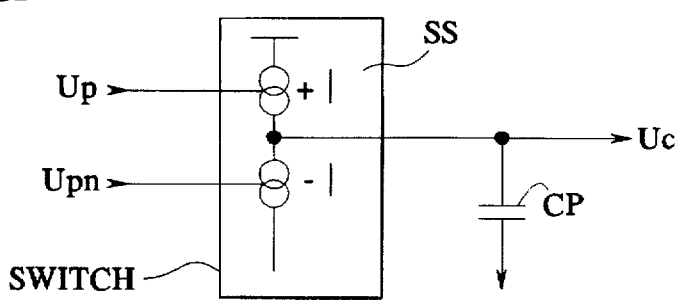
FIG. 4 depicts a model of the current switch in the form of two current sources differing in polarity.

As described in FIG. 4, the current switch SS can be modelled by two current sources differing in polarity. As long as a first input signal Up lies at high level (5 Volts), the positive current source +I is activated and charges the capacitor that is connected to the square-wave generator RG via the switch unit S. In this case, the negative input signal Upn of the current switch lies a low potential (0 Volts). When the input signal Up of the current switch SS switches to low potential (0 Volts), then the respectively connected capacitor is discharged via the negative current source −I. In this case, the negated input signal Upn of the current switch SS is at high level (5 Volts). An output of the current switch SS is coupled to the switch unit S. Likewise, the output of the current switch SS is coupled to an input of the amplifier VS. An output of the amplifier VS is coupled to an input of the high/low level comparator HLK.

A first output outn of the high/low level comparator HLK is coupled to a set input of the RS flip-flop RS. A second output of the high/low level comparator HLK is coupled to a reset input of the RS flip-flop RS. A positive output Q of the RS flip-flop RS is fedback to a first input of the current switch SS and supplies the input signal Up of the current switch SS. Simultaneously, this input signal Up of the current switch SS that is supplied by the RS flip-flop RS represents a first clock signal TAKTN. A negated output QN of the RS flip-flop RS is connected to a second input of the current switch SS at which the negated input signal Upn of the current switch SS is adjacent. The negated input signal Upn of the current switch SS is supplied by the RS flip-flop RS and simultaneously represents a second clock signal TAKT.

An output signal Uc of the current switch SS is amplified in the amplifier unit VS. The high/low level comparator HLK has two comparators, a high level comparator HK and a low level comparator LK.

The high level comparator HK compares the adjacent delta signal to a reference voltage level of preferably 3 Volts and, when the adjacent delta signal exceeds the reference voltage level, outputs a low potential (0 Volts) at the first output outn of the high/low level comparator HLK; otherwise, a high potential (5 Volts). The low level comparator LK works with a comparison potential of preferably 2 Volts and an inverted output. The reference potential of the high level comparator HK need not necessarily amount to the value 3 Volts and that the reference potential of the low level comparator LK need not necessarily amount to 2 Volts but that the reference potentials can also assume other values.

The output signals of the RS flip-flop RS are fedback onto the inputs of the current switch SS. A period duration T of the arising square-wave signal and, thus, the time that the square-wave generator requires for N oscillations are thus dependent on the capacitance the switch unit S connects to the square-wave generator RG, even linearly in the preferred exemplary embodiment.

Figure 5:
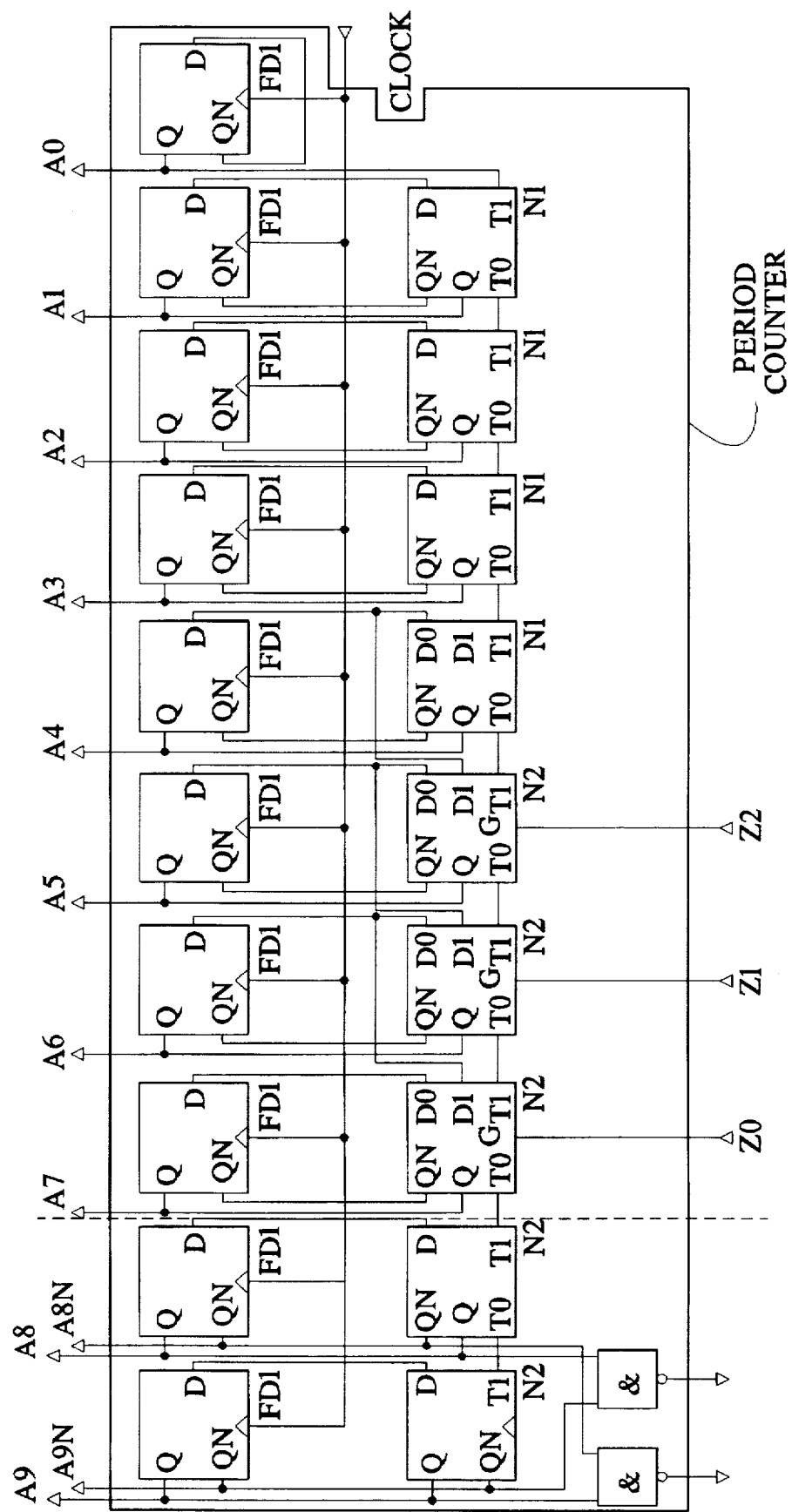
FIG. 5 is a block circuit diagram that shows the period counter of the measuring logic.

The period counter PZ has a synchronously operating counter chain as described, for example, in FIG. 5. The two most significant bits of the period counter PZ control the switch unit S and, thus, the selection of the capacitance to be measured. The period counter PZ thus represents a cycle counter.

In instances wherein the greatest possible resolution is of less concern than a fast measurement, there is the possibility of reducing the measuring time. To this end, the period counter PZ can be designed variable in bit width. As a result thereof, the plurality N of clocks and, thus, the time per measuring cycle can be halved in steps. The plurality of pulses counted in an asynchronous counter AZ (to be described later) is likewise halved, this resulting in a lowering of the resolution of the measurement. When the rapidity of the measurement is more important than the resolution of the measurement, this, however, can be potentially accepted.

Figure 6:
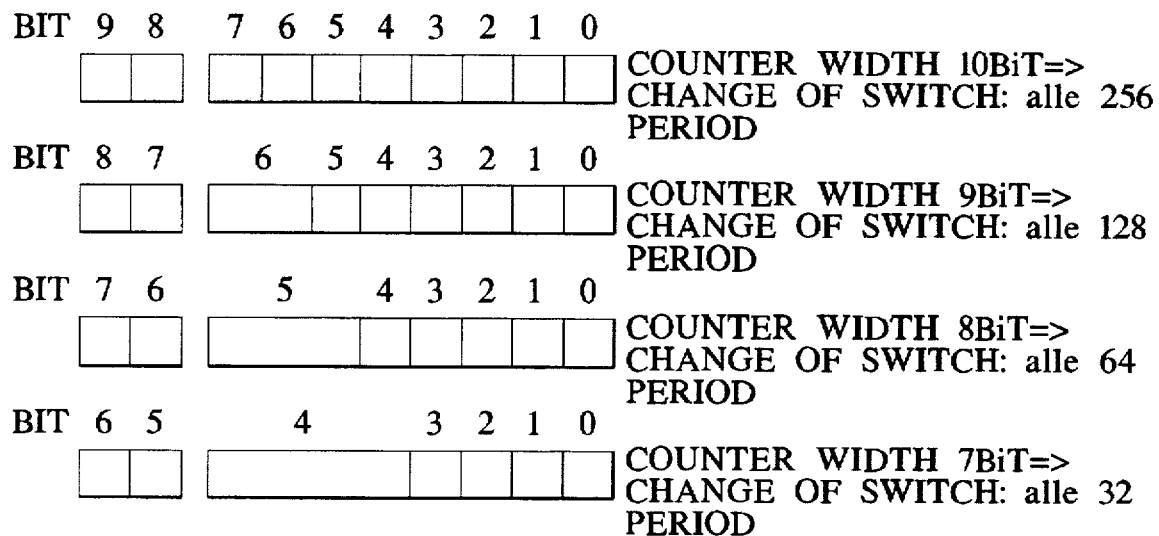
FIG. 6 depicts a sketch that describes the modification of the bit width of the period counter.

The variation of the bit width of the period counter PZ is achieved in that a seventh bit is switched in common with the above bits step-by-step, as shown in FIG. 6. The division factor N is thereby respectively halved, as a result whereof a shorter measuring time derives at the expense of reduced resolution.

The shortening of the counter chain is achieved with the assistance of specific, controllable logic gates N2. Control inputs Z0,Z1 and Z2 of the controllable logic gates N2 are reduced onto two external control inputs RSLN0 and RSLB1 with the assistance of the decoder unit DEC (see FIG. 2).

The following table describes the variation of the bit width of the period counter PZ dependent on the control inputs Z0,Z1 and Z2.

| Z0 | Z1 | Z2 | Counter Width | Clocks / Measuring Cycle |
|----|----|----|---------------|--------------------------|
| 0 | 0 | 0 | 10 bits | 1024 |
| 1 | 0 | 0 | Bits 7 and 6 are switched in common→9bits | 512 |
| 1 | 1 | 0 | Bits 7,6 and 5 are switched in common→8bits | 256 |
| 1 | 1 | 0 | Bits 7,6,5 and 4 are switched in common→7bits | 128 |

The interconnection of the elements that the period counter PZ comprises can be derived from FIG. 5.

Figure 7:
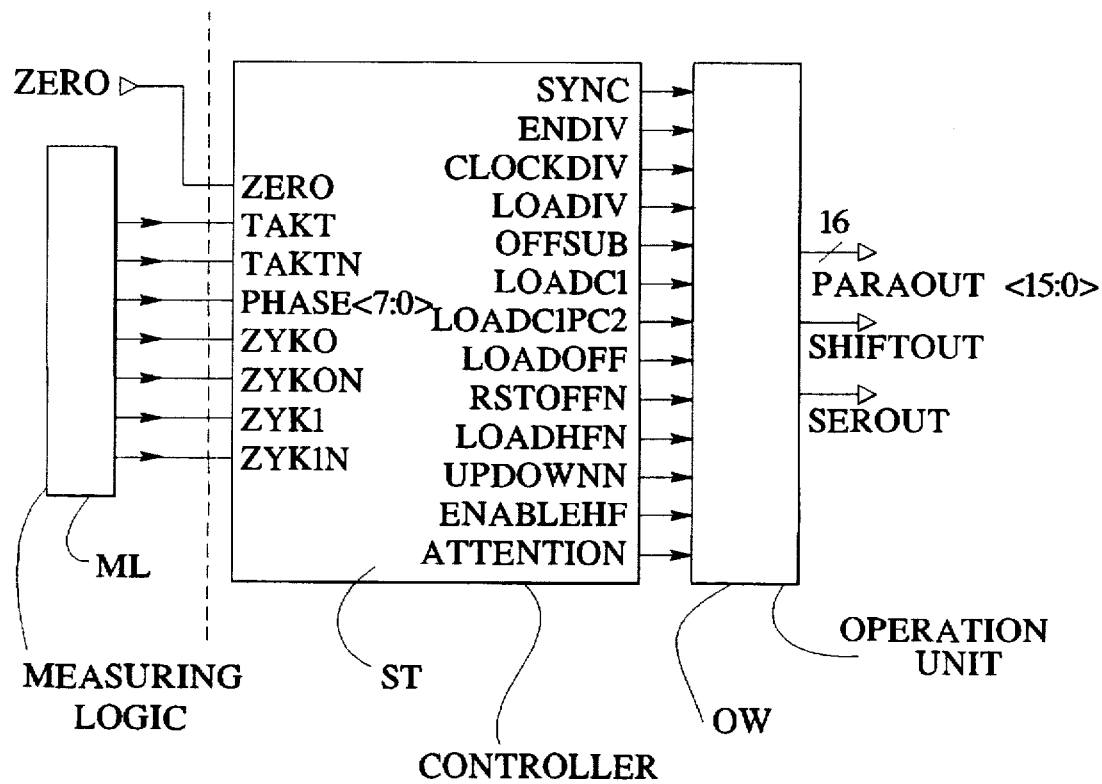
FIG. 7 is a block circuit diagram that shows the structure of the evaluation logic.

In regards to the evaluation logic AL each sub-cycle that is described below extends over a time duration that depends on the measured capacitance. The function of the evaluation logic AL is in allocating a proportional binary value to the time duration and in calculating the capacitance difference between the first capacitance C1 and the second capacitance C2 from the aquired values. This occurs by measuring the time required for a sub-cycle with an RF clock. FIG. 7 schematically describes the structure of the evaluation logic AL. The evaluation logic AL is subdivided into the controller ST and an operation unit OW. In the preferred exemplary embodiment, the evaluation logic AL is realized in digital form. However, the evaluation logic can also be realized in analog form. The invention is thus not limited to a digital evaluation logic AL but also covers an analog evaluation logic AL whose structure is familiar to every person skilled in the art.

Figure 9:
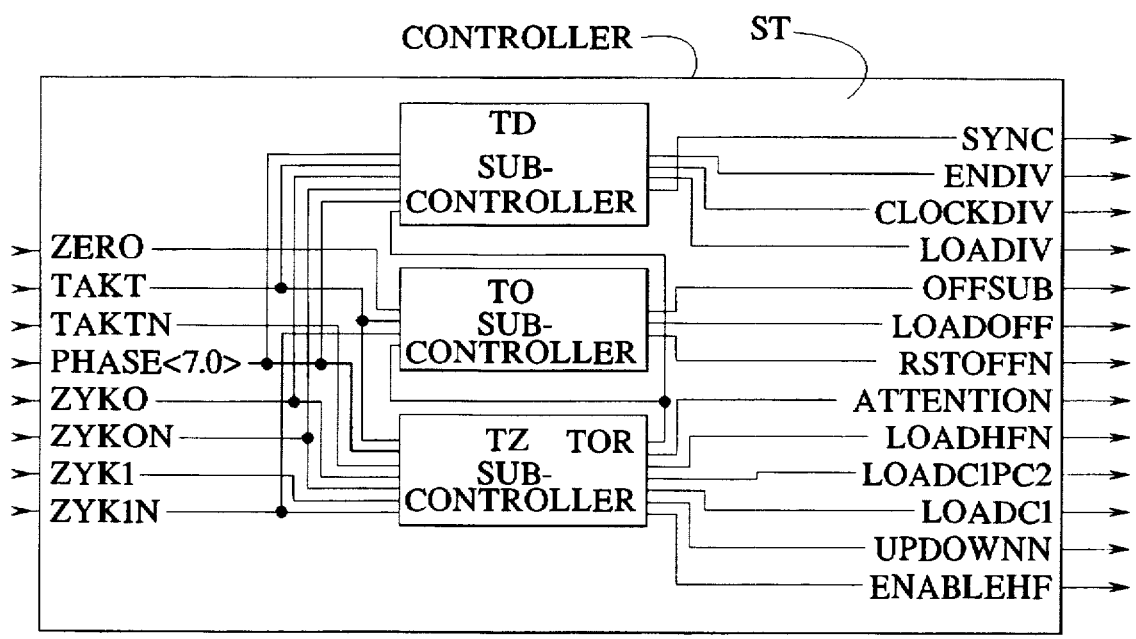
FIG. 9 is a block circuit diagram that describes the controller of the evaluation logic.
Figure 10:
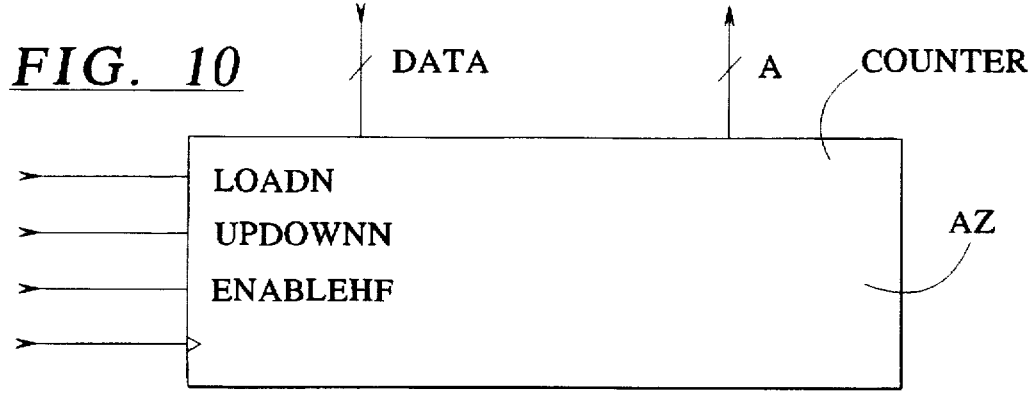
FIG. 10 is a block circuit diagram that shows the asynchronous counter present in the operation unit.

Since, however, a digital evaluation logic AL has further advantages as compared to an analog evaluation logic AL, the preferred exemplary embodiment with digital evaluation logic AL is described. The fact that the evaluation logic AL is constructed of digital modules has a number of advantages. One advantage is in a comparatively low hardware outlay for realizing the overall circuit arrangement. A further advantage is in the output of the result in digital form, as a result whereof a problem free adaptation to a micro-controller system is possible. The controller ST, which, as described in FIG. 9, is divided into three sub-controllers, assumes the coordination of the actions implemented in the operation unit OW. To this end, inputs of the controller ST are coupled to the measuring logic ML. The allocation of the inputs to the corresponding terminals at the measuring logic ML may be seen on the basis of the reference characters shown in FIG. 7 and FIG. 2.

Figure 8:
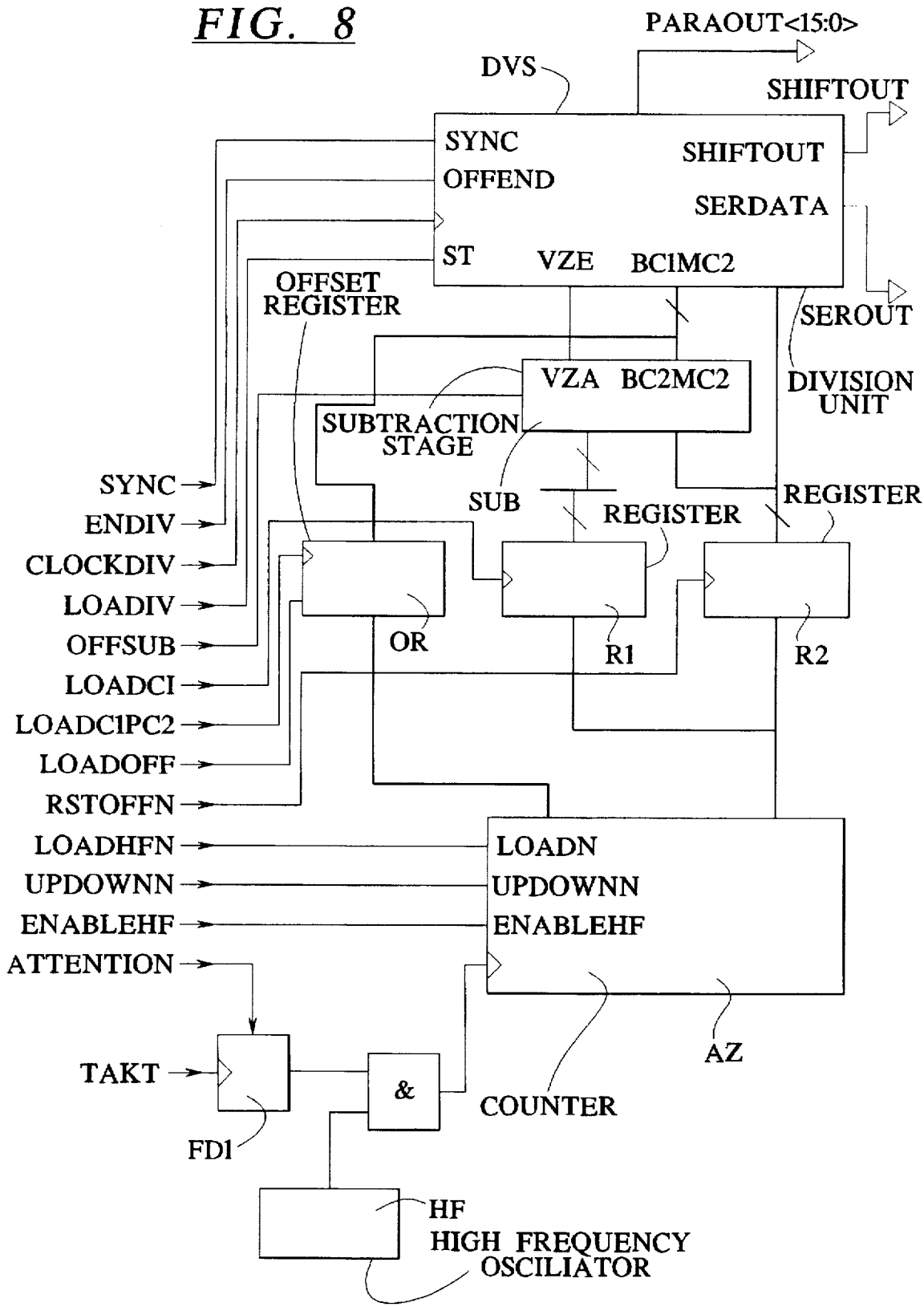
FIG. 8 is a block circuit diagram that describes the operation unit of the evaluation logic.

A first sub-controller TD of the controller ST is responsible for the control of a division unit DVS that is located in the operation unit OW (see FIG. 8). A second sub-controller TO controls an offset compensation that is potentially provided. A third sub-controller TZ serves for the control of the asynchronous counter AZ that is likewise located in the operation unit OW. The respective control signals are indicated in FIG. 9 and in FIG. 8, as a result whereof the various controllers may be seen.

An AND gate & is controlled by a D-flip-flop that is coupled to an output of an HF-oscillator HF via a second input. An output of the AND gate & is coupled to a counting input ZP of the asynchronous counter AZ. Any other, desired counter that can process input signals of adequately high frequencies can, of course, be employed for realizing the asynchronous counter AZ. The counting direction of the asynchronous counter AZ is determined by the third sub-controller TZ via the signal UPDOWN (see FIGS. 9 and 10).

The asynchronous counter AZ can also be pre-occupied with a specific starting value. Given a potentially provided offset compensation, the pre-occupation values is composed of the negative difference of the first capacitance $C_1$ and the second capacitance $C_2$. The asynchronous counter AZ is pre-occupied with the value 0 when no offset compensation is provided.

As may be seen from FIG. 8, three registers are also provided in the operation unit OW of the evaluation logic AL. An offset register OR is coupled to a data input DATA of the asynchronous counter AZ as well as to an output BC2MC2 of the subtraction stage SUB. The output BC2MC2 is also coupled to an input BC1MC2 of a division stage DVS. An operational sign output VZA of the subtraction stage SUB is coupled to an operational sign input VZE of the division stage DVS.

A first register R1 is coupled to a second output A of the asynchronous counter AZ. The first register R1, in which the value of the first capacitance $C_1$ is stored, is also connected to a first input E1 of the subtraction stage SUB. A second input of the subtraction stage SUB is coupled to a second register R2 in which the sum value of the first capacitance $C_1$ and the second capacitance $C_2$ is stored, that is, the value $C_1+C_2$. The second register R2 is likewise coupled to the second output A of the asynchronous counter AZ.

The structure of the operation unit OW can likewise vary according to the variation of the inventive method employed. Variations of the inventive method as well as variations of the operation unit OW deriving therefrom are described below.

Figure 12:
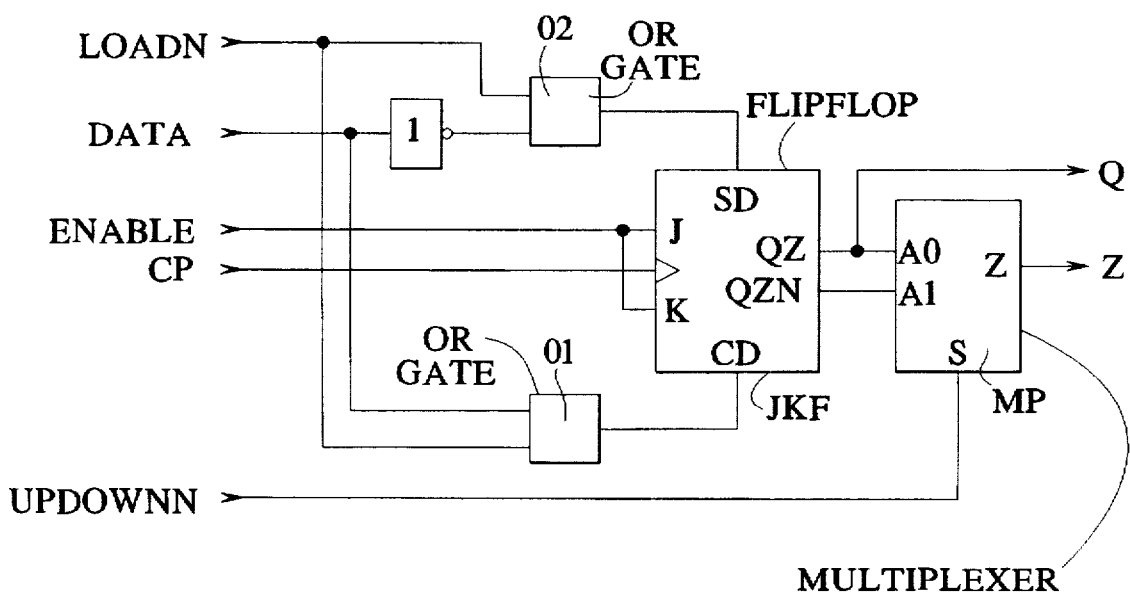
FIG. 12 is a block circuit diagram of a counter module that is employed in the asynchronous counter.
Figure 13:
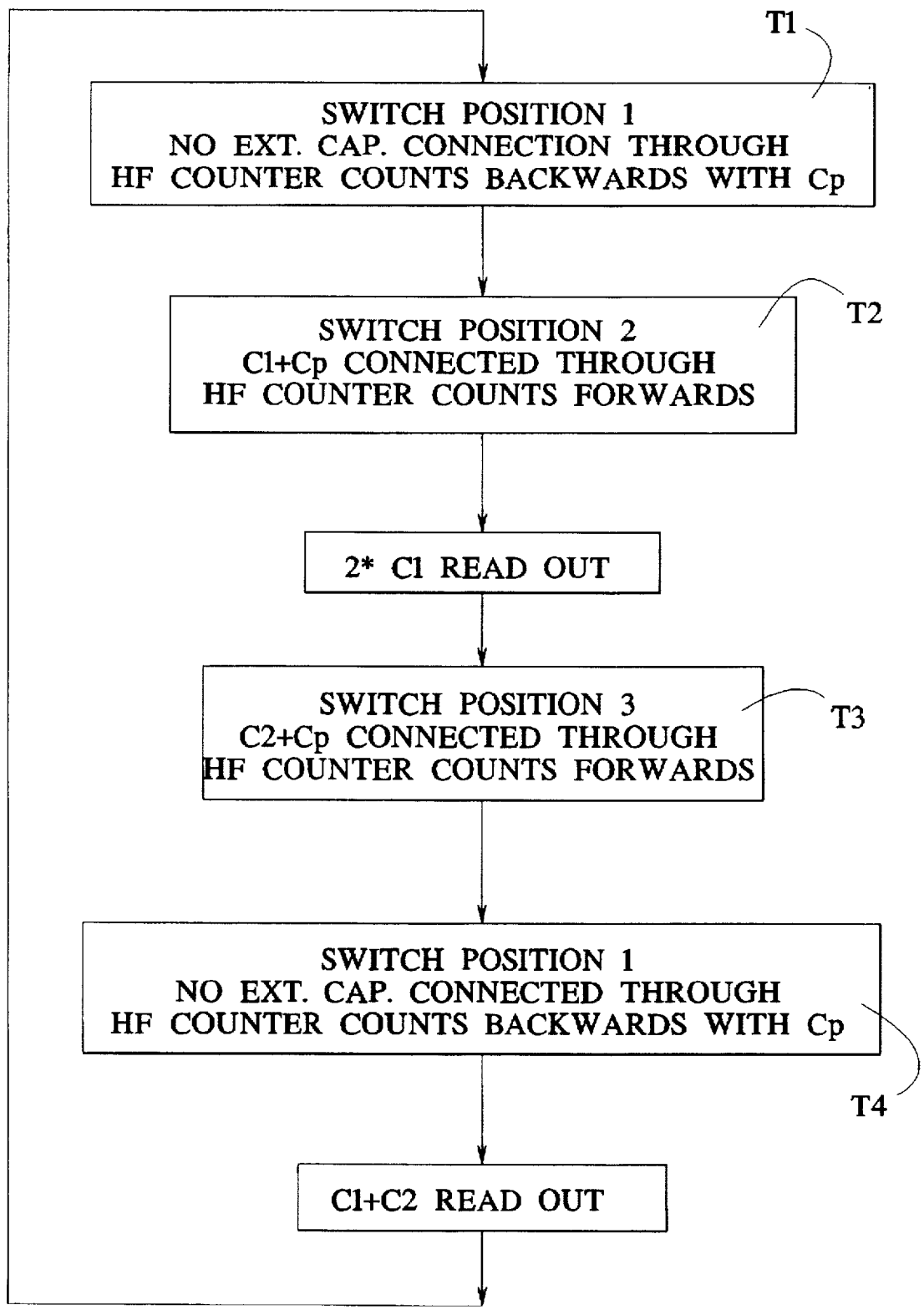
FIG. 13 is a flowchart that describes the sequence of a measuring cycle.

In this preferred exemplary embodiment, the asynchronous counter AZ comprises a chain of 25 toggle flip-flops connected consecutively, their structure being shown in FIG. 12.

Figure 11:
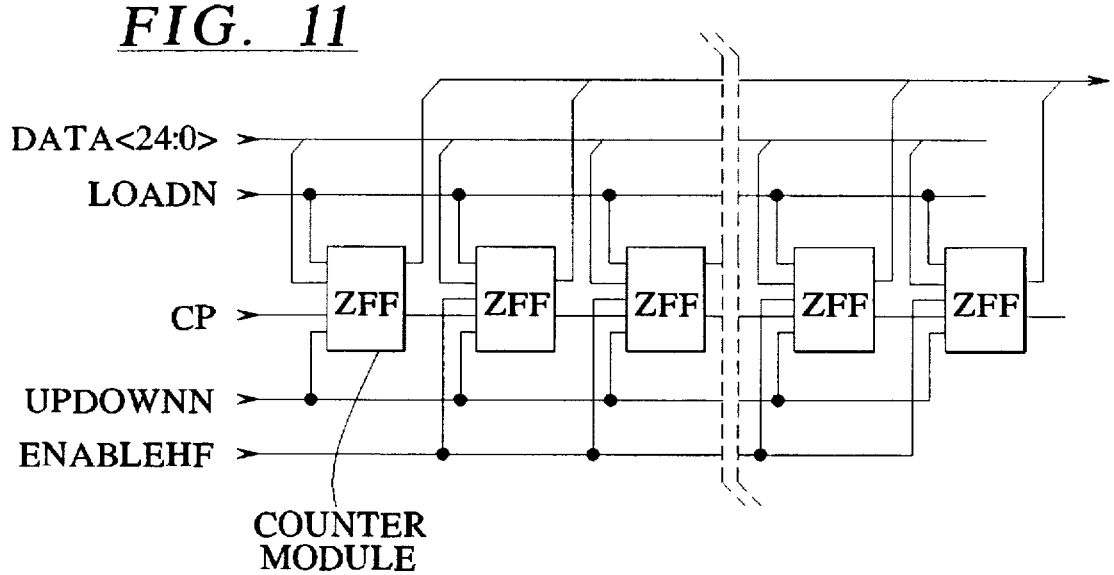
FIG. 11 is a circuit diagram of the asynchronous counter.

FIG. 11 shows the specific structure of the asynchronous counter AZ. At the beginning of every measuring cycle, the content of the offset register OR is read into the asynchronous counter AZ via the data input DATA with the respective leading edge of a signal LOADN. The signal UPDOWN controls the counting direction of the asynchronous counter AZ. The asynchronous counter AZ is deactivated by a signal ENABLEHF during the change in counting direction in order to assure that the current counter reading is preserved unmodified when switching the counting direction. The current counter reading of the asynchronous counter AZ can be interrogated at the second output A of the asynchronous counter AZ.

As shown in FIG. 12, a counter module ZFF employed in the asynchronous counter AZ in the preferred exemplary embodiment has the following structure. A JK-flip-flop JKF has both a first terminal J as well as a second terminal K coupled to the signal ENABLEHF. A terminal CD is coupled via a first OR gate O1 to, first, a signal LOADN and, second, to the data line of the data input DATA of the asynchronous counter that respectively represents the location of the counter module within the asynchronous counter AZ. A terminal SD of the JK-flip-flop is coupled to a second OR gate O2 at whose inputs, first, the signal LOADN and, second, the inverted signal that depends on the respective line of the data input DATA of the asynchronous counter AZ are adjacent. The JK-flip-flop has an output QZ coupled to a first input A0 of a multiplexer MP. A negated output QZN of the JK-flip-flop lies at a second input A1 of the multiplexer MP. Dependent on whether the signal UPDOWN is logical 0 or logical 1, either a signal adjacent at the output QZ of the JK-flip-flop or a signal adjacent at the negated output QZN is through-connected to an output Z of the multiplexer MP.

One possibility of measuring the difference in capacitance between the first capacitance $C_1$ and the second capacitance $C_2$ is comprised, for example, in the method described below.

At the beginning of the method, the unwanted capacitance $C_P$ is measured isolated in that the switch unit S is placed into the first switch position S1. As a result thereof, all parasitic effects that can be modelled by an unwanted capacitance $C_P$ at the input ERG of the square-wave generator RG is measured isolated in this switch position. The switch unit S remains in the first switch position S1 for the length of a first sub-cycle T1. Each sub-cycle, which is controlled by the period counter PZ, has the respective length of N clocks. The counting direction of the asynchronous counter AZ is set such in the first sub-cycle T1 that the asynchronous counter AZ counts backward. The HF oscillator HF is connected through to the asynchronous counter AZ via the AND gate as soon as the switch unit S has selected a capacitance and the measured oscillator MO is in its steady state.

The assurance that the measuring oscillator is in a steady state can be achieved, for example, in that a wait is carried out for a period of the square-wave generator RG until the HF oscillator HF can connected through onto the asynchronous counter AZ. Switching errors are eliminated by this measure. Other measures, for a example a different criterion for determining the time by which the HF oscillator HF has connected through onto the asynchronous counter AZ, are known to a person skilled in the art and can be unproblematically implemented by a person skilled in the art.

After the first sub-cycle T1, the asynchronous counter AZ contains a value that represents the negative unwanted capacitance $C_P$. In a second sub-cycle T2, which is likewise N clocks long, the switch unit S is brought into the second switch position S2, as a result whereof the disturbed first Capacitance $C_1'$ is connected through to the square-wave generator RG. The disturbed first capacitance $C_1'$ derives from the sum of the first capacitance $C_1$ and the unwanted capacitance $C_P$. In the second sub-cycle, T2, the counting direction of the asynchronous counter AZ is set such by the controller ST that the asynchronous counter AZ counts forward.

The output clock of the HF oscillator HF is again through-connected onto the asynchronous counter AZ via the AND gate. The asynchronous counter AZ thus counts in the second sub-cycle T2 until a value is reached that represents the value of the disturbed first capacitance $C_1'$. Since the counter reading of the asynchronous counter AZ was at a value at the beginning of the second sub-cycle T2 representing the negative unwanted capacitance $C_P$, the counter reading of the asynchronous counter AZ after the second sub-cycle T2 exactly represents the value of the first capacitance $C_1$ since $$-C_P + C_1' = -C_P + C_1 + C_P = C_1.$$

The value representing the first capacitance $C_1$ is now read out from the asynchronous counter AZ and is multiplied by the factor 2. This value is stored in the first register R1. In a third sub-cycle T3 that now follows and that likewise lasts N clocks, the switch unit S is brought into the third switch position S3, as a result whereof the disturbed second capacitance $C_2'$ is through-connected to the square-wave generator RG. The counting direction of the asynchronous counter AZ is again set such that the asynchronous counter AZ counts forward.

After the third sub-cycle T3, the asynchronous counter AZ thus contains a value that represents the term $C_1 + C_2 + C_P$, since $$C_1 + C_2' = C_1 + C_2 + C_P.$$

In a fourth sub-cycle T4, the switch unit S is again brought into the first switch position S1, as a result whereof only the unwanted capacitance $C_P$ is measured in isolation.

Since the asynchronous counter AZ counts backward in the fourth sub-cycle T4, the asynchronous counter AZ again comprises a counter reading after the fourth sub-cycle T4 that represents the term $C_1 + C_2$, that is the sum of the first capacitance $C_1$ and the second capacitance $C_2$, since $$C_1 + C_2 + C_P - C_P = C_1 + C_2.$$

Figure 14:
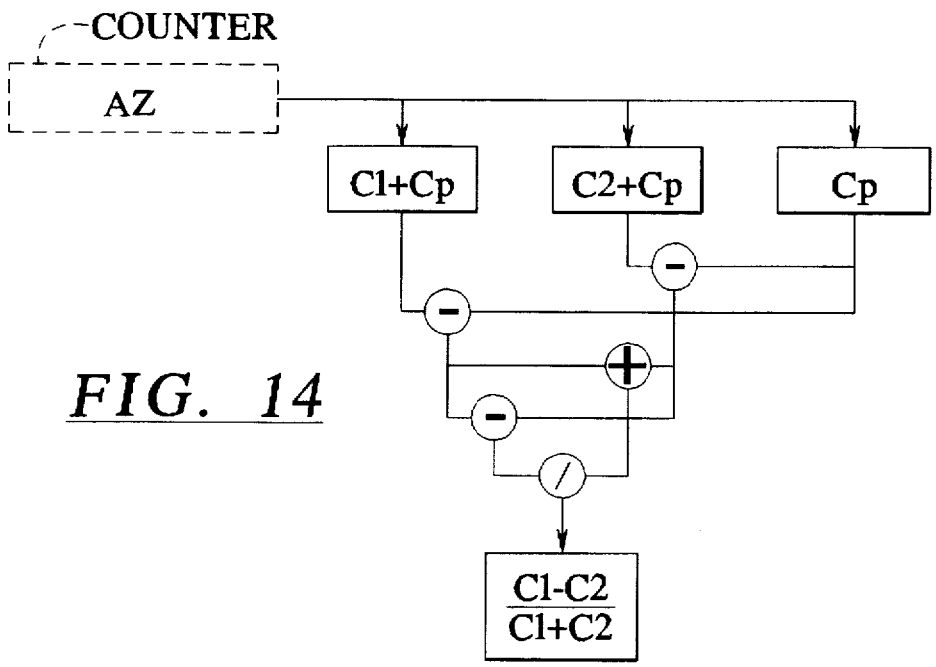
FIG. 14 is a block circuit diagram that describes a possible procedure for calculating the difference in capacitance between two capacitances that are subject to the influence of a disturbance.
Figure 15:
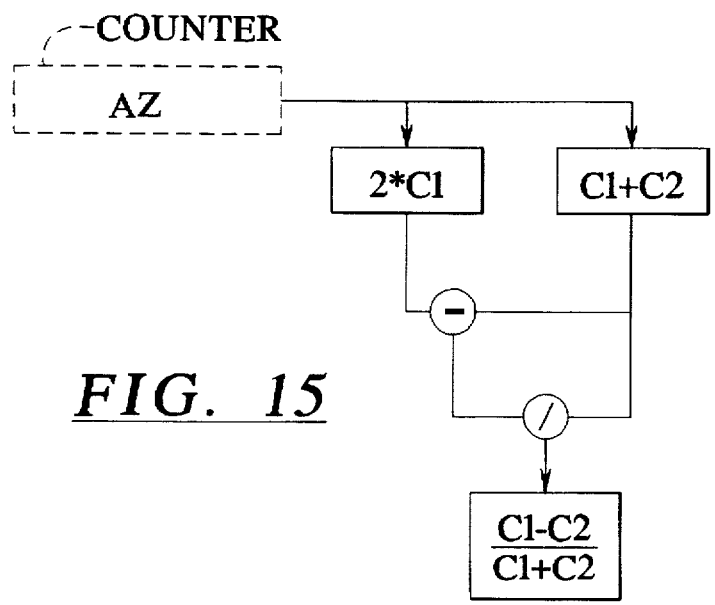
FIG. 15 is a block circuit diagram that describes a modified procedure for calculating the difference in capacitance between two capacitances that are subject to the influence of a disturbance.

All parasitic effects that can be modelled by the unwanted capacitance $C_P$ have thus been compensated. The value of the asynchronous counter AZ, which now represents the sum of the first capacitance $C_1$ and the second capacitance $C_2$, is stored in the second register. FIG. 15 shows how, as a result of the above-described method, the term $$\frac{C_1 - C_2}{C_1 + C_2}$$

which describes a relative capacitance difference between the first capacitance $C_1$ and the second capacitance $C_2$, is simplified by comparison to the standard calculation method employed, as shown in FIG. 14.

Deviating method steps of the method described above in that, for example, the asynchronous counter AZ never counts backward but is respectively reset after a sub-cycle and the value at the end of a sub-cycle is intermediately stored in a separate register, and further calculation is implemented on the basis of the intermediately stored values in the various registers can be implemented.

Of course, the inventive circuit arrangements also changes according to such elementary changes in the inventive method. The inventive circuit arrangement therefore does not cover only the described, preferred exemplary embodiment.

In order to achieve an offset compensation, which is particularly advantageous given differential capacitors, the negative difference between the two capacitance, that is, between the first capacitance $C_1$ and the second capacitance $C_2$, is formed in the quiescent condition. This value is subsequently subtracted from the numerator and denominator of the quotient $$\frac{C_1 - C_2}{C_1 + C_2}$$

This occurs by pre-occupation of the asynchronous counter AZ with the negative capacitance difference at the beginning of each and every measuring cycle. The error that arises due to a non-ideal quiescent condition of a differential capacitor is thus reduced.

What is to be understood by an ideal quiescent condition is that both capacitances, that is, the first capacitance $C_1$ and the second capacitance $C_2$, are identical. In reality, however, the middle electrode of a differential capacitor is always at some distance from the middle of the differential capacitor, as a result whereof an offset arises that, however, can be reduced in the method disclosed above.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A circuit arrangement for measuring a difference in capacitance between a first capacitance and a second capacitance, comprising:
- a switch unit that, dependent on a switch position of the switch unit, is connected to the first capacitance, the second capacitance or to neither of the first and second capacitances, said switch unit being controlled by a period counter via a first output of the period counter;
- a square-wave generator connected to the switch unit, said square-wave generator supplying a square-wave signal having a frequency dependent on a capacitance of the first or second capacitor that is selected by the switch unit;
- an input of the period counter being coupled to an output of the measuring oscillator;
- the plurality of square-wave signals supplied by the measuring oscillator in a sub-cycle of N clocks of a measuring cycle being made available via a second output of the period counter; and
- an evaluation logic coupled to the second output of the period counter for calculating a difference in capacitance between the first capacitance and the second capacitance, whereby a value is allocated to a time duration of the respective sub-cycle, the value being proportional to the time duration, the difference in capacitance being determined from said value.

2. The circuit arrangement according to claim 1, wherein the period counter has a variable bit length.

3. The circuit arrangement according to claim 1, wherein the evaluation logic is realized in analog form.

4. The circuit arrangement according to claim 1, wherein the evaluation logic is realized in digital form.

5. The circuit arrangement according to claim 4, wherein the evaluation logic has a controller that defines the counting direction of an asynchronous counter; and wherein the asynchronous counter coupled to the controller is coupled to a high-frequency oscillator via an AND gate.

6. The circuit arrangement according to claim 5, wherein the evaluation logic has an operation unit that is coupled to the asynchronous counter and to the controller.

7. A circuit arrangement for measuring a difference in capacitance between a first capacitance and a second capacitance, comprising:
- a switch unit that, dependent on a switch position of the switch unit, is connected to the first capacitance, the second capacitance or to neither of the first and second capacitances, said switch unit being controlled by a period counter via a first output of the period counter;
- a square-wave generator connected to the switch unit, said square-wave generator supplying a square-wave signal having a frequency dependent on a capacitance of the first or second capacitor that is selected by the switch unit;
- an input of the period counter being coupled to an output of the measuring oscillator;
- the plurality of square-wave signals supplied by the measuring oscillator in a sub-cycle of N clocks of a measuring cycle being made available via a second output of the period counter;
- an evaluation logic coupled to the second output of the period counter for calculating a difference in capacitance between the first capacitance and the second capacitance, whereby a value is allocated to a time duration of the respective sub-cycle, the value being proportional to the time duration, the difference in capacitance being determined from said value; and
- the evaluation logic having a controller that defines the counting direction of an asynchronous counter, the asynchronous counter coupled to the controller being coupled to a high-frequency oscillator via an AND gate, the evaluation logic also having an operation unit coupled to the asynchronous counter and to the controller.

8. The circuit arrangement according to claim 7, wherein the period counter has a variable bit length.

* * * * *